United States Patent
Liu et al.

(10) Patent No.: US 11,637,127 B2
(45) Date of Patent: Apr. 25, 2023

(54) DISPLAY SUBSTRATE AND METHOD FOR FORMING THE SAME AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jun Liu, Beijing (CN); Liangchen Yan, Beijing (CN); Bin Zhou, Beijing (CN); Yang Zhang, Beijing (CN); Tongshang Su, Beijing (CN); Wei Li, Beijing (CN); Liusong Ni, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 17/206,254

(22) Filed: Mar. 19, 2021

(65) Prior Publication Data
US 2021/0296365 A1    Sep. 23, 2021

(30) Foreign Application Priority Data
Mar. 19, 2020   (CN) .......................... 202010195565.5

(51) Int. Cl.
*H01L 27/00*    (2006.01)
*H01L 29/00*    (2006.01)
*H01L 27/12*    (2006.01)
*H01L 29/786*    (2006.01)

(52) U.S. Cl.
CPC ........ *H01L 27/1218* (2013.01); *H01L 27/127* (2013.01); *H01L 27/1225* (2013.01); *H01L 27/1237* (2013.01); *H01L 27/1262* (2013.01); *H01L 29/78633* (2013.01)

(58) Field of Classification Search
CPC . H01L 27/127; H01L 27/1225; H01L 27/124; H01L 27/1218; H01L 27/1288; H01L 27/1237; H01L 27/1262; H01L 29/78633; H01L 29/7869; H01L 29/66757; H01L 29/4908
See application file for complete search history.

(56) References Cited

U.S. PATENT DOCUMENTS 9,397,122 B2 * 7/2016 Lim ..................... H01L 27/3272
10,403,757 B2 * 9/2019 Zhou ..................... H01L 27/3244
(Continued)

*Primary Examiner* — Nikolay K Yushin
(74) *Attorney, Agent, or Firm* — Brooks Kushman P.C.

(57) ABSTRACT

A display substrate, a method for forming the display substrate and a display device are provided. The display substrate includes: a first conductive pattern located on a base substrate, where a ring-shaped conductive protection structure is arranged at an edge of a preset region of the first conductive pattern and surrounds the preset region, and the conductive protection structure is made of an anti-dry-etching material; an insulation layer covering the first conductive pattern; and a second conductive pattern located on a side of the insulation layer away from the first conductive pattern, where the second conductive pattern is electrically connected to the first conductive pattern through the via-hole.

19 Claims, 2 Drawing Sheets

(56) References Cited

U.S. PATENT DOCUMENTS

| | | | |
|---|---|---|---|
| 2016/0049426 A1* | 2/2016 | Lim | H01L 29/78633 438/23 |
| 2019/0165002 A1* | 5/2019 | Cheng | G02F 1/133512 |
| 2019/0172954 A1* | 6/2019 | Zhou | H01L 21/823475 |

* cited by examiner

DISPLAY SUBSTRATE AND METHOD FOR FORMING THE SAME AND DISPLAY DEVICE

CROSS-REFERENCE TO RELATED APPLICATION

This application claims a priority to Chinese Patent Application No. 202010195565.5 filed on Mar. 19, 2020, the disclosure of which is incorporated in its entirety by reference herein.

TECHNICAL FIELD

The present disclosure relates to the field of display technologies, in particular to a display substrate, a method for forming the display substrate and a display device.

BACKGROUND

In a process of forming a display substrate in the related art, when connecting metal patterns of different layers, an insulation layer between the metal patterns of the different layers is etched to form a via-hole. When etching an insulation layer with a relatively large thickness, e.g., the thickness is larger than 550 nm, the etching may take a relatively long time, and a micro-trenching effect, i.e., a phenomenon that an etching depth of an edge part of the via-hole is larger than an etching depth of a center part of the via-hole during the etching process, may occur. In this way, a metal pattern under the edge part of the via-hole may be also etched and damaged, which may affect the yield of the display substrate.

SUMMARY

A display substrate is provided, including: a first conductive pattern located on a base substrate, where a ring-shaped conductive protection structure is arranged at an edge of a preset region of the first conductive pattern and surrounds the preset region, and the conductive protection structure is made of an anti-dry-etching material; an insulation layer covering the first conductive pattern, where the insulation layer includes a via-hole corresponding to the preset region, and an orthographic projection of the via-hole onto the base substrate is surrounded by an orthographic projection of the conductive protection structure onto the base substrate, and the orthographic projection of the via-hole onto the base substrate partially overlaps the orthographic projection of the conductive protection structure onto the base substrate; and a second conductive pattern located on a side of the insulation layer away from the first conductive pattern, where the second conductive pattern is electrically connected to the first conductive pattern through the via-hole.

Optionally, the first conductive pattern is made of Mo or an alloy of Mo, and the conductive protection structure is made of Cu, ITO or IGZO.

Optionally, the first conductive pattern further includes a ring-shaped protrusion surrounding the preset region, and the conductive protection structure is configured to cover the protrusion.

Optionally, a height of the protrusion ranges from 0.05 µm to 0.10 µm, and a thickness of the conductive protection structure ranges from 0.015 µm to 0.02 µm.

Optionally, a diameter of an outer contour of the orthographic projection of the conductive protection structure onto the base substrate is D, a diameter of an outer contour of an orthographic projection of the protrusion onto the base substrate is d, and D is larger than d by 2 µm to 3 µm.

Optionally, the first conductive pattern is a pattern of a light-shielding metal layer, and the second conductive pattern is a pattern of a source-drain metal layer.

Optionally, the display substrate further includes: the pattern of the light-shielding metal layer located on the base substrate; the conductive protection structure located on a side of the pattern of the light-shielding metal layer away from the base substrate; a buffer layer located on a side of the pattern of the light-shielding metal layer 2 and the conductive protection structure away from the base substrate; an active layer located on a side of the buffer layer away from the base substrate; a gate insulation layer located on a side of the active layer away from the base substrate; a pattern of a gate metal layer located on a side of the gate insulation layer away from the base substrate; an interlayer insulation layer located on a side of the pattern of the gate metal layer away from the base substrate, where the buffer layer and the interlayer insulation layer constitute the insulation layer; the pattern of the source-drain metal layer located on a side of the interlayer insulation layer away from the base substrate, where the pattern of the source-drain metal layer is electrically connected to the pattern of the light-shielding metal layer through the via-hole penetrating the buffer layer and the interlayer insulation layer; and a passivation layer located on a side of the pattern of the source-drain metal layer away from the base substrate.

Optionally, the second conductive pattern is in contact with the preset region of the first conductive pattern through the via-hole, to enable the second conductive pattern to electrically connect to the first conductive pattern.

Optionally, a cross-section of the via-hole is of a circular or square shape.

Optionally, the conductive protection structure is connected to the protrusion in parallel.

A display device is further provided, including the above-mentioned display substrate.

A method for forming a display substrate is further provided, including: forming a first conductive pattern on a base substrate; forming a ring-shaped conductive protection structure at an edge of a preset region of the first conductive pattern and surrounding the preset region, where the conductive protection structure is made of an anti-dry-etching material; forming an insulation layer covering the first conductive pattern; performing a dry-etching on the insulation layer to form a via-hole penetrating the insulation layer, where an orthographic projection of the via-hole onto the base substrate is surrounded by an orthographic projection of the conductive protection structure onto the base substrate, and the orthographic projection of the via-hole onto the base substrate partially overlaps the orthographic projection of the conductive protection structure onto the base substrate; and forming a second conductive pattern on the insulation layer, where the second conductive pattern is electrically connected to the first conductive pattern through the via-hole.

Optionally, the forming the first conductive pattern on the base substrate includes: forming a ring-shaped protrusion surrounding the preset region on a surface of the first conductive pattern facing the insulation layer; the forming the conductive protection structure includes: forming the conductive protection structure covering the protrusion.

Optionally, the first conductive pattern is made of Mo or an alloy of Mo, and the conductive protection structure is made of Cu, ITO or IGZO.

Optionally, the first conductive pattern further includes a ring-shaped protrusion surrounding the preset region, and the conductive protection structure is configured to cover the protrusion.

Optionally, a height of the protrusion ranges from 0.05 μm to 0.10 μm, and a thickness of the conductive protection structure ranges from 0.015 μm to 0.02 μm.

Optionally, a diameter of an outer contour of the orthographic projection of the conductive protection structure onto the base substrate is D, a diameter of an outer contour of an orthographic projection of the protrusion onto the base substrate is d, and D is larger than d by 2 μm~3 μm.

Optionally, the first conductive pattern is a pattern of a light-shielding metal layer, and the second conductive pattern is a pattern of a source-drain metal layer.

Optionally, the method further includes: forming the pattern of the light-shielding metal layer on the base substrate; forming the conductive protection structure on a side of the pattern of the light-shielding metal layer away from the base substrate; forming a buffer layer on a side of the pattern of the light-shielding metal and the conductive protection structure away from the base substrate; forming an active layer on a side of the buffer layer away from the base substrate; forming a gate insulation layer on a side of the active layer away from the base substrate; forming a pattern of a gate metal layer on a side of the gate insulation layer away from the base substrate; forming an interlayer insulation layer on a side of the pattern of the gate metal layer away from the base substrate, where the buffer layer and the interlayer insulation layer constitute the insulation layer; forming the pattern of the source-drain metal layer on a side of the interlayer insulation layer away from the base substrate, where the pattern of the source-drain metal layer is electrically connected to the pattern of the light-shielding metal layer through the via-hole penetrating the buffer layer and the interlayer insulation layer; and forming a passivation layer on a side of the pattern of the source-drain metal layer away from the base substrate.

Optionally, the second conductive pattern is in contact with the preset region of the first conductive pattern through the via-hole, to enable the second conductive pattern to electrically connect to the first conductive pattern.

DETAILED DESCRIPTION

Figure 1:
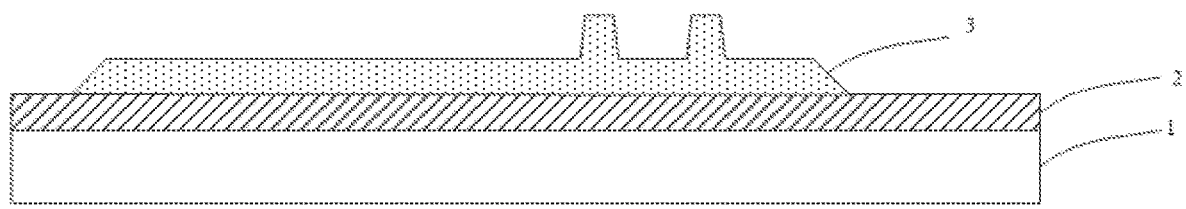
FIG. 1 to FIG. 6 are schematic diagrams of a process of forming a display substrate according to the embodiments of the present disclosure.

In order to make the technical problems to be solved, the technical solutions and the advantages of the embodiments of the present disclosure more apparent, a detail description will be given hereinafter in conjunction with the drawings and embodiments.

In a process of forming a display substrate in the related art, in order to increase a storage capacitance, a pattern of a light-shielding metal layer is connected to a drain electrode of a thin film transistor. A buffer layer and an interlayer insulation layer laminated one on another are arranged between the light-shielding metal layer and the drain electrode of the thin film transistor. When etching the buffer layer and the interlayer insulation layer to form a via-hole through which the drain electrode is connected to the light-shielding metal layer, due to a thickness of the buffer layer and the interlayer insulation layer is relatively large, the etching may take a relatively long time, a micro-trenching effect at the via-hole may occur, and the light-shielding metal layer at an edge of the via-hole may be also damaged, so that there may be a poor contact between the light-shielding metal layer and the drain electrode, thereby affecting the yield of the display substrate.

A display substrate, a method for forming the display substrate and a display device are provided in the embodiments of the present disclosure, so as to ensure the yield of the display substrate.

A display substrate is provided, including: a first conductive pattern located on a base substrate, where a ring-shaped conductive protection structure is arranged at an edge of a preset region of the first conductive pattern and surrounds the preset region, and the conductive protection structure is made of an anti-dry-etching material; an insulation layer covering the first conductive pattern, where the insulation layer includes a via-hole corresponding to the preset region, and an orthographic projection of the via-hole onto the base substrate is surrounded by an orthographic projection of the conductive protection structure onto the base substrate, and the orthographic projection of the via-hole onto the base substrate partially overlaps the orthographic projection of the conductive protection structure onto the base substrate; and a second conductive pattern located on a side of the insulation layer away from the first conductive pattern, where and the second conductive pattern is electrically connected to the first conductive pattern through the via-hole.

In this embodiment, the ring-shaped conductive protection structure is formed at the edge of the preset region of the first conductive pattern corresponding to the via-hole, and the conductive protection structure is made of the anti-dry-etching material. In this way, when a dry etching is performed on the insulation layer covering the first conductive pattern to form the via-hole exposing the first conductive pattern, the conductive protection structure may protect the first conductive pattern at the edge of the via-hole, and prevent the first conductive pattern from being damaged in a dry-etching process, thereby ensuring the yield of the display substrate.

The ring-shaped conductive protection structure matches a shape of the via-hole of the insulation layer, and may cover the first conductive pattern at the edge of the via-hole. When a cross-section of the via-hole is of a circular shape, the conductive protection structure is of a circular shape. When the cross-section of the via-hole is of a square shape, the conductive protective structure is of a square shape, and so on.

Optionally, the first conductive pattern is made of Mo or an alloy of Mo, which may be etched in the dry etching process. The conductive protection structure is made of Cu, ITO or IGZO, which may be not etched in the dry etching process. When the first conductive pattern is made of Mo or an alloy of Mo, which may be etched in the dry etching process, so that when the insulation layer is etched in the dry etching process to form the via-hole, it is possible to cause a damage to the first conductive pattern. After the conductive protective structure has been formed on the first conductive pattern, since the conductive protective structure is not etched in the dry etching process, it may prevent ions in the dry etching process from moving downward to etch the first conductive pattern, so as to avoid an inward undercut during etching and the micro-trenching effect, and prevent the first conductive pattern from being damaged in the dry etching process, thereby ensuring the yield of the display substrate.

Optionally, the first conductive pattern further includes a ring-shaped protrusion surrounding the preset region, and the conductive protection structure is configured to cover the protrusion. In this way, the conductive protection structure may be connected to the protrusion in parallel, so as to reduce a resistance of the first conductive pattern at the via-hole.

Optionally, a height of the protrusion may range from 0.05 µm to 0.10 µm, and a thickness of the conductive protection structure may range from 0.015 µm to 0.02 µm. Of course, the height of the protrusion is not limited to the above value, and the thickness of the conductive protection structure is not limited to the above value, and may be another value.

Optionally, a diameter of an outer contour of the orthographic projection of the conductive protection structure onto the base substrate is D, a diameter of an outer contour of an orthographic projection of the protrusion onto the base substrate is d, and D is larger than d by 2 µm~3 µm. In this way, it may be ensured that the conductive protection structure may completely cover the protrusion, so as to prevent the protrusion from being damaged in the dry etching process.

The first conductive pattern and the second conductive pattern may be any two conductive patterns arranged in different layers in the display substrate. Optionally, the first conductive pattern is a pattern of a light-shielding metal layer, and the second conductive pattern is a pattern of a source-drain metal layer.

Figure 6:
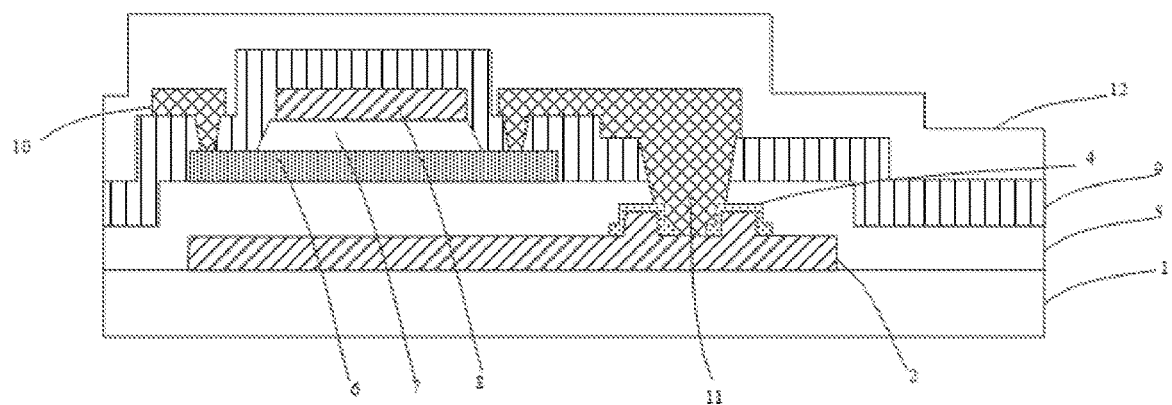

Optionally, as shown in FIG. 6, the display substrate further includes: the pattern of the light-shielding metal layer 2 located on the base substrate 1; the conductive protection structure 4 located on a side of the pattern of the light-shielding metal layer 2 away from the base substrate 1; a buffer layer 5 located on a side of the pattern of the light-shielding metal layer 2 and the conductive protection structure 4 away from the base substrate 1; an active layer 6 located on a side of the buffer layer 5 away from the base substrate; a gate insulation layer 7 located on a side of the active layer 6 away from the base substrate 1; a pattern of a gate metal layer located on a side of the gate insulation layer 7 away from the base substrate 1, where the pattern of the gate metal layer includes a gate electrode 8; an interlayer insulation layer 9 located on a side of the pattern of the gate metal layer away from the base substrate 1, where the buffer layer 5 and the interlayer insulation layer 9 constitute the insulation layer; the pattern of the source-drain metal layer located on a side of the interlayer insulation layer 9 away from the base substrate 1, where the pattern of the source-drain metal layer includes a source electrode 10 and a drain electrode 11, and the pattern of the source-drain metal layer is electrically connected to the pattern of the light-shielding metal layer 2 through the via-hole penetrating the buffer layer 5 and the interlayer insulation layer 9; and a passivation layer 12 located on a side of the pattern of the source-drain metal layer away from the base substrate 1.

The light-shielding metal layer 2 may be made of Mo or an alloy of Mo, and the conductive protection structure 4 may be made of ITO.

A display device is further provided in the embodiments of the present disclosure, including the above-mentioned display substrate.

The display device includes but is not limited to: a radio frequency unit, a network module, an audio output unit, an input unit, a sensor, a display unit, a user input unit, an interface unit, a memory, a processor, a power supply and other components. It should be appreciated that a structure of the above display device should not be construed as limiting the display device, and the display device may include more or less of above components, or a combination of some components, or different components. In the embodiments of the present disclosure, the display device includes, but is not limited to, a display, a mobile phone, a tablet computer, a television, a wearable electronic device, a navigation display device, etc.

The display device may be any product or component having a display function, such as a television, a display, a digital photo frame, a mobile phone, a tablet computer, etc. The display device may further include a flexible circuit board, a printed circuit board and a back plate.

The present disclosure further provides in some embodiments a method for forming a display substrate, which includes: forming a ring-shaped conductive protection structure at an edge of a preset region of the first conductive pattern and surrounding the preset region, where the conductive protection structure is made of an anti-dry-etching material; forming an insulation layer covering the first conductive pattern; performing a dry-etching on the insulation layer to form a via-hole penetrating the insulation layer, where an orthographic projection of the via-hole onto the base substrate is surrounded by an orthographic projection of the conductive protection structure onto the base substrate, and the orthographic projection of the via-hole onto the base substrate partially overlaps the orthographic projection of the conductive protection structure onto the base substrate; and forming a second conductive pattern on the insulation layer, where the second conductive pattern is electrically connected to the first conductive pattern through the via-hole.

In this embodiment, the ring-shaped conductive protection structure is formed at the edge of the preset region of the first conductive pattern corresponding to the via-hole, and the conductive protection structure is made of the anti-dry-etching material. In this way, when dry etching is performed on the insulation layer covering the first conductive pattern to form the via-hole exposing the first conductive pattern, the conductive protection structure may protect the first conductive pattern at the edge of the via-hole, and prevent the first conductive pattern from being damaged in a dry etching process, thereby ensuring the yield of the display substrate.

Optionally, the forming the first conductive pattern on the base substrate includes: forming a ring-shaped protrusion surrounding the preset region on a surface of the first conductive pattern facing the insulation layer; the forming the conductive protection structure includes: forming the conductive protection structure covering the protrusion.

The conductive protection structure may cover the protrusion, so that the conductive protection structure may be connected to the protrusion in parallel, thereby reducing a resistance of the first conductive pattern at the via-hole.

For example, the first conductive pattern is a pattern of a light-shielding metal layer, and the second conductive pattern is a pattern of a source-drain metal layer, the method for forming the display substrate may include the following steps.

Step 1, as shown in FIG. 1, forming the light-shielding metal layer 2 on the base substrate 1. The base substrate 1 may be a quartz substrate or a glass substrate. The light-shielding metal layer 2 may be made of Mo or an alloy of MoNb, a thickness of the light-shielding metal layer 2 may range from 0.20 µm to 0.25 µm.

A pattern of a photoresist 3 is formed on the light-shielding metal layer 2. Specifically, the photoresist may be exposed by using a halftone mask to form a photoresist-reserved region, a photoresist-partially-reserved region and a photoresist-removed region. The photoresist-reserved region is ring-shaped, and surrounds the preset region where the via-hole is to be formed, a thickness thereof is about 2.2 µm, a diameter of a ring-shaped structure ranges from 3 µm to 4 µm. The photoresist-partially-reserved region corresponds to the pattern of the light-shielding metal layer 2, a thickness thereof may be about 1.5 µm.

Figure 2:

Step 2, as shown in FIG. 2, etching the light-shielding metal layer 2 in the photoresist-removed region. Specifically, the light-shielding metal layer 2 may be etched by using a mixed acid (a mixture of a nitric acid, an acetic acid and a phosphoric acid) to form the pattern of the light-shielding metal layer 2.

After that, the photoresist 3 is not removed, and the photoresist is ashed by using oxygen to remove the photoresist of a thickness of 1.5 µm. The photoresist in the photoresist-partially-reserved region is removed, and a ring-shaped photoresist pattern is formed on the pattern of the light-shielding metal layer 2. Then dry etching may be performed on the light-shielding metal layer 2 by using $CF_4$ and $O_2$. A target etching thickness of the light-shielding metal layer 2 ranges from 0.05 µm to 0.10 µm. After the dry etching process has been finished, the photoresist 3 is removed to form a structure as shown in FIG. 2, i.e., a light-shielding metal ring formed at the edge of the preset region where the via-hole is to be formed, and a thickness of the ring may be 0.05 µm.

Figure 3:
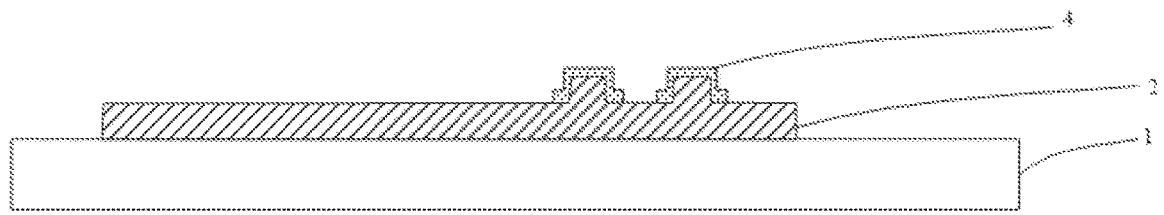

Step 3, as shown in FIG. 3, depositing a layer of an ITO layer with a thickness of 0.015 µm~0.02 µm on the base substrate 1, and forming the conductive protection structure 4 in a patterning process. Specifically, the ITO may be etched and removed in a patterning process by using a mixed acid (a mixture of a sulfuric acid, an acetic acid and a phosphoric acid) or an oxalic acid, to form a circular ITO pattern. An outer diameter of an ITO ring is larger than an outer diameter of the light-shielding metal ring by 2 µm to 3 µm.

Figure 4:
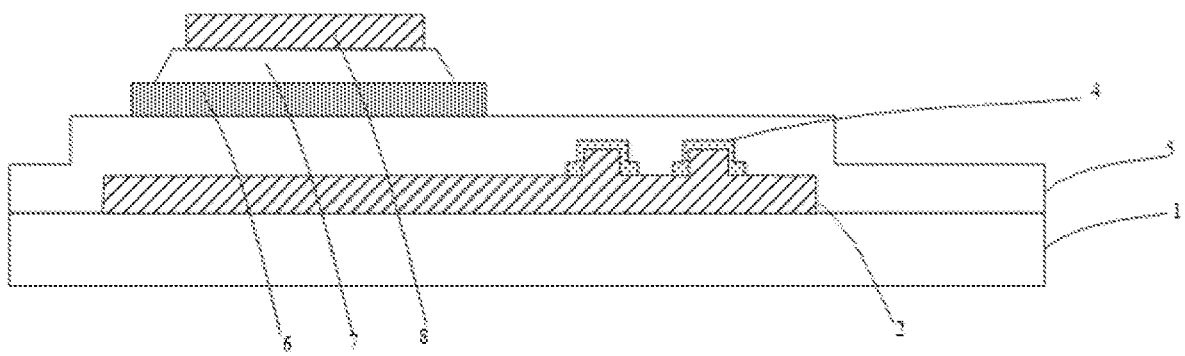

Step 4, as shown in FIG. 4, depositing the buffer layer 5, which may be made of silicon oxide, and a thickness of which ranges from 0.3 µm to 0.5 µm. Next, a semiconductor material layer is formed, and is further patterned to form the active layer 6. The active layer 6 may be made of IGZO, a thickness thereof ranges from 0.05 µm to 0.08 µm. Next, the gate insulation layer 7 may be formed, and made of silicon oxide, a thickness thereof ranges from 0.1 µm to 0.2 µm. A gate metal layer is formed, and is further patterned to form such patterns as the gate electrode 8 and a gate wiring. The gate metal layer may be made of such metal as copper and a thickness thereof ranges from 0.6 µm to 0.8 µm. The gate electrode 8 and the gate wiring may be formed in a wet etching process. For example, wet etching may be performed on the copper by using $H_2O_2$ chemical solution. After the pattern of the gate metal layer has been formed, dry etching may be performed on the gate insulation layer 7 by using the pattern of the gate metal layer as a mask to form a pattern of the gate insulation layer 7. Dry etching may be performed by using a mixed gas of high $CF_4$+low $O_2$, where a flow rate of $CF_4$ may range from 2000 sccm to 2500 sccm, and a flow rate of $O_2$ may range from 1000 sccm to 1500 sccm. After the pattern of the gate insulation layer 7 has been formed, a conduction treatment may be performed on the exposed active layer 6 by using ammonia ($NH_3$) or helium (He) to form a source contact region and a drain contact region of the active layer 6.

Figure 5:
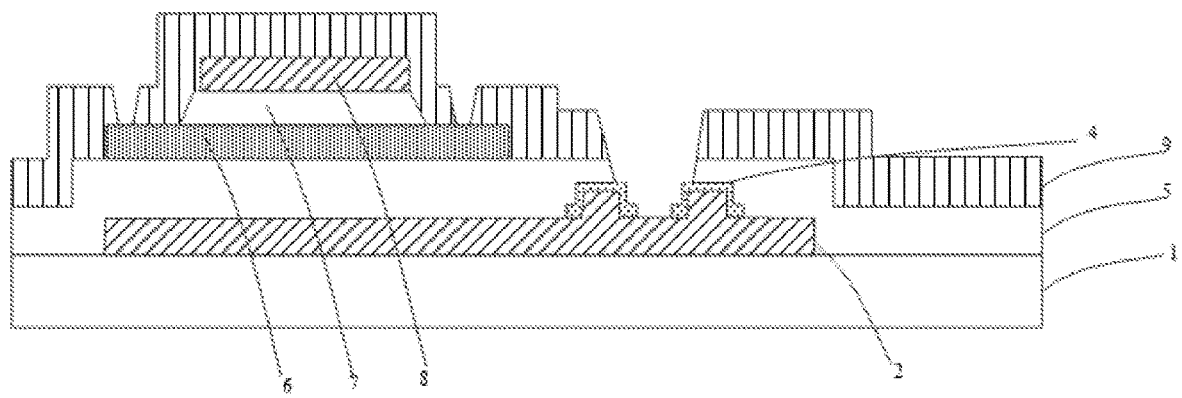

Step 5, as shown in FIG. 5, depositing an interlayer insulation layer 9, which may be made of silicon oxide, and a thickness of which ranges from 0.55 µm to 0.65 µm. Then, dry etching is performed on the interlayer insulation layer 9 and the buffer layer 5 to form a pattern of a contact hole, i.e., a CNT hole. An orthographic projection of the CNT hole onto the light-shielding metal layer 2 falls within a region defined by the conductive protection structure 4, and the orthographic projection of the CNT hole onto the light-shielding metal layer 2 partially overlaps the conductive protection structure 4. A width of an overlapping part ranges from 1 µm to 2 µm, and the drain electrode is connected to the light-shielding metal layer 2 through the formed CNT hole. For Example, dry etching may be performed on the interlayer insulation layer 9 and the buffer layer 5 by using an appropriate mixed gas of $CF_4$+$O_2$, where a flow rate of $CF_4$ may range from 1000 sccm to 1800 sccm, and a flow rate of 02 may range from 1200 sccm to 2000 sccm. Due to the existence of the conductive protective structure 4 during dry etching, even if the ions moving downward, the conductive protective structure 4 is etched. The conductive protective structure 4 is made of such etch-resistant material as ITO that cannot be etched, so as to avoid the micro-trenching effect. Due to the existence of the light-shielding metal ring and ITO ring at the via-hole, an undercut of the buffer layer 5 during forming a deep hole in a dry etching process may also be shielded by the raised etch-resistant material of ITO.

Step 6, as shown in FIG. 6, forming a source-drain metal layer, which may be made of copper, and a thickness of which may range from 0.5 µm to 0.6 µm. The source-drain metal layer is patterned to form such source-drain patterns as a source electrode 11, a drain electrode 12, and a data line. Due to the existence of the ring-shaped conductive protective structure 4 at the CNT hole, the drain electrode 12 is connected to the light-shielding metal layer 2 at the CNT hole in a better manner, thereby avoiding the poor contact. Then a passivation layer (PVX) is deposited, which may be made of silicon oxide, a thickness thereof may range from 0.5 µm to 0.6 µm.

After the above steps, the display substrate as shown in FIG. 6 may be acquired. In this embodiment, for the uneven etching caused by the micro-trenching effect at the edge of the CNT hole, the corresponding ring-shaped conductive protection structure is formed at the edge of the CNT hole by using the etch-resistant material of ITO, so as to avoid the poor contact between the drain electrode and the light-shielding metal layer caused by a larger etching depth at the edge when etching a deep hole. In addition, the corresponding light-shielding metal protrusion and the corresponding ITO conductive protection structure are formed at a ring surrounding the CNT hole, so as to avoid the undercut of the insulation film caused by over-etching during etching the deep hole, thereby affecting the yield of the display substrate.

In each method embodiment of the present disclosure, the sequence number of each step cannot be used to limit the sequence of the steps. For those of ordinary skill in the art, the sequence of each step changed without creative work may also fall within the protection scope of the present disclosure.

It should be appreciated that, each embodiment in the specification is described in a progressive manner and focuses on the differences from other embodiments. For the description of same or similar parts between various embodiments, a cross-reference may be made to the embodiments. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
   a first conductive pattern located on a base substrate, wherein a ring-shaped conductive protection structure is arranged at an edge of a preset region of the first conductive pattern and surrounds the preset region, and the conductive protection structure is made of an anti-dry-etching material;
   an insulation layer covering the first conductive pattern, wherein the insulation layer comprises a via-hole corresponding to the preset region, and an orthographic projection of the via-hole onto the base substrate is surrounded by an orthographic projection of the conductive protection structure onto the base substrate, and the orthographic projection of the via-hole onto the base substrate partially overlaps the orthographic projection of the conductive protection structure onto the base substrate; and
   a second conductive pattern located on a side of the insulation layer away from the first conductive pattern, wherein the second conductive pattern is electrically connected to the first conductive pattern through the via-hole,
   wherein the first conductive pattern further comprises a ring-shaped protrusion surrounding the preset region, and the conductive protection structure is configured to cover the protrusion.

2. The display substrate according to claim 1, wherein the first conductive pattern is made of Mo or an alloy of Mo, and the conductive protection structure is made of Cu, ITO or IGZO.

3. The display substrate according to claim 1, wherein a height of the protrusion ranges from 0.05 μm to 0.10 μm, and a thickness of the conductive protection structure ranges from 0.015 μm to 0.02 μm.

4. The display substrate according to claim 1, wherein a diameter of an outer contour of the orthographic projection of the conductive protection structure onto the base substrate is D, a diameter of an outer contour of an orthographic projection of the protrusion onto the base substrate is d, and D is larger than d by 2 μm to 3 μm.

5. The display substrate according to claim 1, wherein the second conductive pattern is in contact with the preset region of the first conductive pattern through the via-hole, to enable the second conductive pattern to electrically connect to the first conductive pattern.

6. The display substrate according to claim 1, wherein a cross-section of the via-hole is of a circular or square shape.

7. The display substrate according to claim 1, wherein the conductive protection structure is connected to the protrusion in parallel.

8. A display device comprising the display substrate according to claim 1.

9. The display substrate according to claim 1, wherein the first conductive pattern is a pattern of a light-shielding metal layer, and the second conductive pattern is a pattern of a source-drain metal layer.

10. The display substrate according to claim 9, further comprising:
    the pattern of the light-shielding metal layer located on the base substrate;
    the conductive protection structure located on a side of the pattern of the light-shielding metal layer away from the base substrate;
    a buffer layer located on a side of the pattern of the light-shielding metal and the conductive protection structure away from the base substrate;
    an active layer located on a side of the buffer layer away from the base substrate;
    a gate insulation layer located on a side of the active layer away from the base substrate;
    a pattern of a gate metal layer located on a side of the gate insulation layer away from the base substrate;
    an interlayer insulation layer located on a side of the pattern of the gate metal layer away from the base substrate, wherein the buffer layer and the interlayer insulation layer constitute the insulation layer;
    the pattern of the source-drain metal layer located on a side of the interlayer insulation layer away from the base substrate, wherein the pattern of the source-drain metal layer is electrically connected to the pattern of the light-shielding metal layer through the via-hole penetrating the buffer layer and the interlayer insulation layer; and
    a passivation layer located on a side of the pattern of the source-drain metal layer away from the base substrate.

11. A method for forming a display substrate, comprising:
    forming a first conductive pattern on a base substrate;
    forming a ring-shaped conductive protection structure at an edge of a preset region of the first conductive pattern and surrounding the preset region, wherein the conductive protection structure is made of an anti-dry-etching material;
    forming an insulation layer covering the first conductive pattern;
    performing a dry-etching on the insulation layer to form a via-hole penetrating the insulation layer, wherein an orthographic projection of the via-hole onto the base substrate is surrounded by an orthographic projection of the conductive protection structure onto the base substrate, and the orthographic projection of the via-hole onto the base substrate partially overlaps the orthographic projection of the conductive protection structure onto the base substrate; and forming a second conductive pattern on the insulation layer, wherein the second conductive pattern is electrically connected to the first conductive pattern through the via-hole, wherein the forming the first conductive pattern on the base substrate comprises:

forming a ring-shaped protrusion surrounding the preset region on a surface of the first conductive pattern facing the insulation layer;

the forming the conductive protection structure comprises: forming the conductive protection structure covering the protrusion.

12. The method according to claim 11, wherein the first conductive pattern is made of Mo or an alloy of Mo, and the conductive protection structure is made of Cu, ITO or IGZO.

13. The method according to claim 11, wherein the first conductive pattern is a pattern of a light-shielding metal layer, and the second conductive pattern is a pattern of a source-drain metal layer.

14. The method according to claim 13, further comprising:

forming the pattern of the light-shielding metal layer on the base substrate;

forming the conductive protection structure on a side of the pattern of the light-shielding metal layer away from the base substrate;

forming a buffer layer on a side of the pattern of the light-shielding metal and the conductive protection structure away from the base substrate;

forming an active layer on a side of the buffer layer away from the base substrate;

forming a gate insulation layer on a side of the active layer away from the base substrate;

forming a pattern of a gate metal layer on a side of the gate insulation layer away from the base substrate;

forming an interlayer insulation layer on a side of the pattern of the gate metal layer away from the base substrate, wherein the buffer layer and the interlayer insulation layer constitute the insulation layer;

forming the pattern of the source-drain metal layer on a side of the interlayer insulation layer away from the base substrate, wherein the pattern of the source-drain metal layer is electrically connected to the pattern of the light-shielding metal layer through the via-hole penetrating the buffer layer and the interlayer insulation layer; and forming a passivation layer on a side of the pattern of the source-drain metal layer away from the base substrate.

15. The method according to claim 11, wherein the first conductive pattern further comprises a ring-shaped protrusion surrounding the preset region, and the conductive protection structure is configured to cover the protrusion.

16. The method according to claim 15, wherein a height of the protrusion ranges from 0.05 µm to 0.10 µm, and a thickness of the conductive protection structure ranges from 0.015 µm to 0.02 µm.

17. The method according to claim 15, wherein a diameter of an outer contour of the orthographic projection of the conductive protection structure onto the base substrate is D, a diameter of an outer contour of an orthographic projection of the protrusion onto the base substrate is d, and D is larger than d by 2 µm to 3 µm.

18. The method according to claim 15, wherein the second conductive pattern is in contact with the preset region of the first conductive pattern through the via-hole, to enable the second conductive pattern to electrically connect to the first conductive pattern.

19. A method for forming a display substrate, comprising:

forming a first conductive pattern on a base substrate;

forming a ring-shaped conductive protection structure at an edge of a preset region of the first conductive pattern and surrounding the preset region, wherein the conductive protection structure is made of an anti-dry-etching material;

forming an insulation layer covering the first conductive pattern;

performing a dry-etching on the insulation layer to form a via-hole penetrating the insulation layer, wherein an orthographic projection of the via-hole onto the base substrate is surrounded by an orthographic projection of the conductive protection structure onto the base substrate, and the orthographic projection of the via-hole onto the base substrate partially overlaps the orthographic projection of the conductive protection structure onto the base substrate; and forming a second conductive pattern on the insulation layer, wherein the second conductive pattern is electrically connected to the first conductive pattern through the via-hole, wherein the first conductive pattern further comprises a ring-shaped protrusion surrounding the preset region, and the conductive protection structure is configured to cover the protrusion.

* * * * *